United States Patent [19]

Goma et al.

[11] Patent Number: 5,721,517
[45] Date of Patent: Feb. 24, 1998

[54] METHOD OF ADJUSTING THE VARIABLE RANGE OF OSCILLATION FREQUENCY OF A VOLTAGE-CONTROLLED OSCILLATOR

[75] Inventors: Shinji Goma; Tatsuo Bizen, both of Kyoto, Japan

[73] Assignee: Murata Manufacturing Co., Ltd., Japan

[21] Appl. No.: 411,951

[22] Filed: Mar. 28, 1995

[30] Foreign Application Priority Data

Mar. 31, 1994 [JP] Japan .................................. 6-62450

[51] Int. Cl.⁶ .................................................. H03B 5/18
[52] U.S. Cl. ............................... 331/117 R; 331/117 D; 331/179; 331/108 C; 331/177 V; 333/235; 333/246
[58] Field of Search ............................. 331/177 V, 96, 331/117 D, 99, 108 C, 108 D, 117 R, 117 FE, 179; 333/174, 175, 185, 205, 235, 246; 334/65, 66, 69

[56] References Cited

U.S. PATENT DOCUMENTS 3,947,934  4/1976  Olson .......................... 333/175 X
4,035,695  7/1977  Knutson et al. ............... 333/185 X
4,658,223  4/1987  Marvin et al. ................. 331/176
5,087,896  2/1992  Wen et al. ...................... 331/99

FOREIGN PATENT DOCUMENTS 2223125  3/1990  United Kingdom.
2263594  7/1993  United Kingdom.
2269715  2/1994  United Kingdom.

OTHER PUBLICATIONS

Great Britain Search Report dated May 30, 1995.

Primary Examiner—Robert Pascal
Assistant Examiner—Arnold Kinkead
Attorney, Agent, or Firm—Ostrolenk, Faber, Gerb & Soffen, LLP

[57] ABSTRACT

A resonance inductor of a resonant circuit is formed of a chip inductor and an inductance fine adjustment pattern. A resonance capacitor is formed of a plurality of chip layered capacitors connected in parallel to each other via connection patterns formed on a substrate. The connection patterns are sequentially disconnected to adjust the capacitance of the resonance capacitor. Then, the inductance fine adjustment pattern is partially removed to adjust the inductance of the resonance inductor.

7 Claims, 3 Drawing Sheets

OSCILLATION FREQUENCY

5,721,517

METHOD OF ADJUSTING THE VARIABLE RANGE OF OSCILLATION FREQUENCY OF A VOLTAGE-CONTROLLED OSCILLATOR

BACKGROUND OF THE INVENTION

1. Field of the Invention

The present invention relates to a method of adjusting the variable range of oscillation frequency of a voltage-controlled oscillator (referred to as VCO hereinafter). Particularly, the present invention relates to a method of adjusting the variable range of oscillation frequency suitable for a VCO having an oscillation frequency of not more than 300 MHz.

2. Description of the Prior Art

FIG. 1 is a circuit diagram showing an example of a conventional VCO. Referring to FIG. 1, a VCO 10 includes a resonance circuit 11, an oscillation stage 12, a buffer stage 13, and an output matching stage 14. Resonance circuit 11 has a resonance frequency which varies according to a control voltage Vc applied to a control terminal C. Oscillation stage 12 has an oscillation frequency determined by the resonance frequency of resonance circuit 11. Buffer stage 13 amplifies a signal output from oscillation stage 12, and prevents variation of the oscillation frequency in oscillation stage 12 due to a change in load. Output matching stage 14 is made to conform to the circuit of the next stage connected to an output terminal P and suppresses harmonics.

Resonance circuit 11 includes a coupling capacitor C1, a variable capacitance diode VD, a resonance inductor L1, and a resonance capacitor C2. Control voltage Vc applied to control terminal C is provided to the cathode of variable capacitance diode VD and one end of coupling capacitor C1 via a C/N (Carrier/Noise) characteristics compensation inductor L2. Variable capacitance diode VD has its anode grounded. The other end of coupling capacitor C1 is connected to respective ends of resonance inductor L1, resonance capacitor C2, and coupling capacitor C7. Resonance inductor L1 and resonance capacitor C2 have their other ends grounded.

Oscillation stage 12 includes an oscillation transistor Q1 which has its base connected to the other end of coupling capacitor C7. A bias voltage which is a power supply voltage $V_B$ divided by bias resistors R1 and R2 connected in series between a power supply terminal B and ground is supplied to the base of oscillation transistor Q1. A capacitor C5 is connected between the base and emitter of oscillation transistor Q1. A resistor R3 and a capacitor C4 are connected in parallel between the emitter of oscillation transistor Q1 and ground. Capacitors C5 and C4 form a Colpitts capacitor. Oscillation transistor Q1 forms a Colpitts oscillator together with capacitors C5, C4 and resonance inductor L1 to carry out an oscillation operation according to the resonant frequency of resonance circuit 11.

The oscillation output of oscillation stage 12 is provided to buffer stage 13 via coupling capacitor C8. Buffer stage 13 includes a buffer transistor Q2 which has the oscillation output of oscillation stage 4 applied to the base thereof. A bias voltage which is power supply voltage $V_B$ divided by bias resistors R4 and R5 connected in series between power supply terminal B and ground is applied to the base of buffer transistor Q2. Buffer transistor Q2 has its emitter grounded and its collector connected to power supply terminal B via a choke coil L3 in output matching stage 14.

Output matching stage 14 includes choke coil L3, a coupling capacitor C10 and an output matching capacitor C11. Coupling capacitor C10 has one end connected to the collector of buffer transistor Q2 and the other end connected to output terminal P. Output matching capacitor C11 has one end connected to output terminal P and the other end grounded. High-frequency bypass capacitors C6 and C12 are connected between power supply terminal B and ground. A high-frequency bypass capacitor C3 is connected between control terminal C and ground. Such a VCO 10 of the above circuit configuration has each component mounted on a substrate such as alumina. A change in the capacitance of the variable capacitance diode VD in resonance circuit 11 according to the value of control voltage Vc causes a variation in the resonant frequency of resonance circuit 11, whereby oscillation stage 12 carries out an oscillation operation at that resonant frequency. An oscillation signal thereof is output from output terminal P. The above described VCO 10 has variable oscillation frequency within a predetermined range.

However, the variable range of the oscillation frequency of VCO 10 is shifted when a variation occurs in the characteristic values of resonance inductor L1, resonance capacitor C2, etc. forming resonance circuit 11. More specifically, as shown in FIG. 2, the required variable range of oscillation frequency indicated by reference character A may be offset to the lower level as shown by B or to the higher level as shown by C.

Therefore, an offset in the variable range of oscillation frequency is corrected by various conventional methods set forth in the following:

(1) A trimmer capacitor is used for coupling capacitor C1 and resonance capacitor C2 to allow modification of the capacitance thereof.

(2) Resonance inductor L1 is formed so as to include an inductance adjustment pattern printed on the substrate, and the inductance value is modified by partially removing the fine adjustment pattern.

(3) Resonance capacitor C2 is formed by a pair of comb-like patterns printed on a substrate, and the capacitance is modified by partially removing that pattern.

(4) An air-core inductor is used for resonance inductor L1, and the inductance is modified by deforming the coil.

The above (1) has the disadvantage that the usage of a trimmer capacitor necessitates rotation of the rotary shaft to adjust the capacitance, which is a bottleneck to automatic adjustment thereof. There is also the problem that the adjustment process of the oscillation frequency variable range becomes tedious. As to the above methods (2) and (3) where an inductance fine adjustment pattern or a pair of comb-like patterns are used, automation of adjusting the inductance and capacitance is facilitated since automation of the process of removing a portion thereof is simple. There is an advantage that the adjustment process of the oscillation frequency variable range is facilitated. However, in a VCO having a relatively low oscillation frequency of less than 300 MHz, correction of the offset in the oscillation frequency variable range just by means of such a pattern is limited to only a small range of adjustment unless a pattern having a large area is provided. Increasing the pattern area will result in a VCO of a greater size.

When an air-core coil is used as in the above method (4), difficulty in the automation of the deformation process thereof will become a bottleneck in the automation of adjusting the inductance. There is also the problem that the adjustment process of the oscillation frequency variable range is complicated.

SUMMARY OF THE INVENTION

In view of the foregoing, the main object of the present invention is to provide a method of adjusting the variable range of oscillation frequency of a voltage-controlled oscillator in which the adjustment process of the oscillation frequency variable range is easily carried out and the size of the VCO is not increased.

A pair of patterns for connection is formed on a substrate. A resonance capacitor includes a plurality of chip capacitors connected in parallel between the connection patterns. The capacitance of the plurality of chip capacitors all connected in parallel is selected so that the oscillation frequency variable range is at a frequency level lower than a predetermined range. By sequentially disconnecting the connection patterns, any of the plurality of chip capacitors can be disconnected from the resonance circuit to decrease the capacitance of the resonance capacitor, whereby the oscillation frequency variable range is shifted to the higher frequency level to be adjusted to lie within the predetermined range.

According to the present invention, the resonance capacitor of the resonance circuit is formed of a plurality of chip capacitors connected in parallel via respective connection patterns on the substrate, wherein the capacitance is adjusted by disconnecting the connection pattern. Therefore, automation of the disconnection process is simple to facilitate the adjusting process of the oscillation frequency variable range. Since the resonance capacitor is formed of chip capacitors, the voltage-controlled oscillator will not be increased in size.

Preferably, the connection patterns are arranged in parallel to each other. The connection patterns are sequentially disconnected from one end towards the other end. According to the present embodiment, the process of sequentially disconnecting the connection patterns is made more simple to further facilitate the adjustment process of the oscillation frequency variable range.

More preferably, the plurality of chip capacitors include capacitors of different capacitance, and are arranged sequentially in the descending order of a greater capacitance. The connection pattern of a chip capacitor of a greater capacitance is first disconnected, followed by the disconnection of the connection pattern of a chip capacitor having a smaller capacitance. Therefore, fine adjustment of the oscillation frequency variable range is enabled.

According to another aspect of the present invention, a pair of connection patterns facing each other and an inductance fine adjustment pattern are formed on a substrate. A resonance inductor is formed of a chip inductor and an inductance fine adjustment pattern connected in series between a pair of opposing connection patterns. The resonance capacitor includes a plurality of chip capacitors connected in parallel between the connection patterns. The capacitance of all the chip capacitors connected in parallel is selected so that the oscillation frequency variable range is set to a lower frequency range. By sequentially disconnecting the connection patterns, any of the plurality of chip capacitors can be disconnected from the resonance circuit to reduce the capacitance of the resonance capacitor. The oscillation frequency variable range is first shifted to a level higher than the predetermined range. The inductance fine adjustment pattern is partially removed to increase the inductance of the resonance inductor. As a result, the oscillation frequency variable range is shifted to the lower level to be adjusted to a predetermined range.

According to another aspect of the present invention, the capacitance of the resonance capacitor can be adjusted by disconnecting the connection pattern formed on the substrate. The inductance fine adjustment pattern formed on the substrate is partially removed to adjust the inductance of the resonance inductor. Therefore, automation of the disconnection process and removal process is made simple to facilitate the adjustment of the oscillation frequency variable range. Furthermore, since fine adjustment of the inductance value is allowed, the oscillation frequency variable range can also be adjusted in fine levels. Since the resonance capacitor is formed of a chip capacitor, and the resonance inductor is formed of a chip inductor and an inductance fine adjustment pattern, the voltage-controlled oscillator is not increased in size.

Preferably, the connection patterns formed on the substrate are arranged parallel to each other, so that disconnecting the connection patterns sequentially is facilitated. Thus, adjustment of the oscillation frequency variable range can be carried out easily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
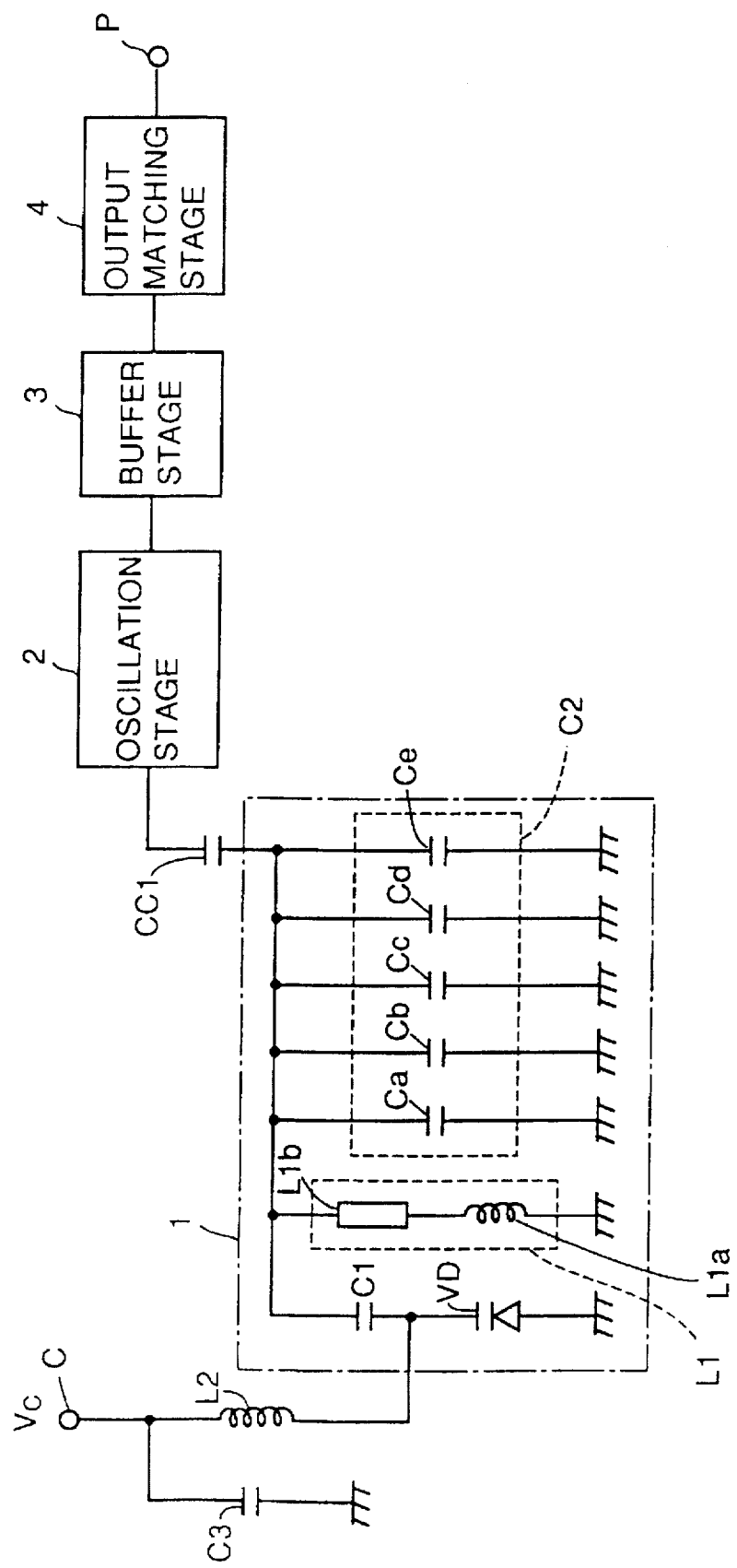
FIG. 3 is a circuit diagram according to an embodiment of the present invention.

FIG. 3 is a circuit diagram of a VCO for describing the method of adjusting the oscillation frequency variable range of a VCO. Since the embodiment of FIG. 3 is characterized in its resonance circuit portion, the resonance circuit portion is illustrated by a circuit diagram, and oscillation stage 2, buffer stage 3, and output matching stage 4 are illustrated by block diagrams.

A resonance circuit 1 includes a coupling capacitor C1, a variable capacitance diode VD, a resonance inductor L1 and a resonance capacitor C2. Control voltage Vc applied to a control terminal C is provided to variable capacitance diode VD via a C/N characteristics compensation inductor L2. Resonance inductor L1 includes a main inductor L1$a$, and a fine adjustment inductor L1$b$ connected in series thereto. Resonance capacitor C2 includes a plurality of capacitors Ca, Cb, Cc, Cd, and Ce connected in parallel. A high-frequency bypass capacitor C3 is connected between control terminal C and ground.

Figure 1:
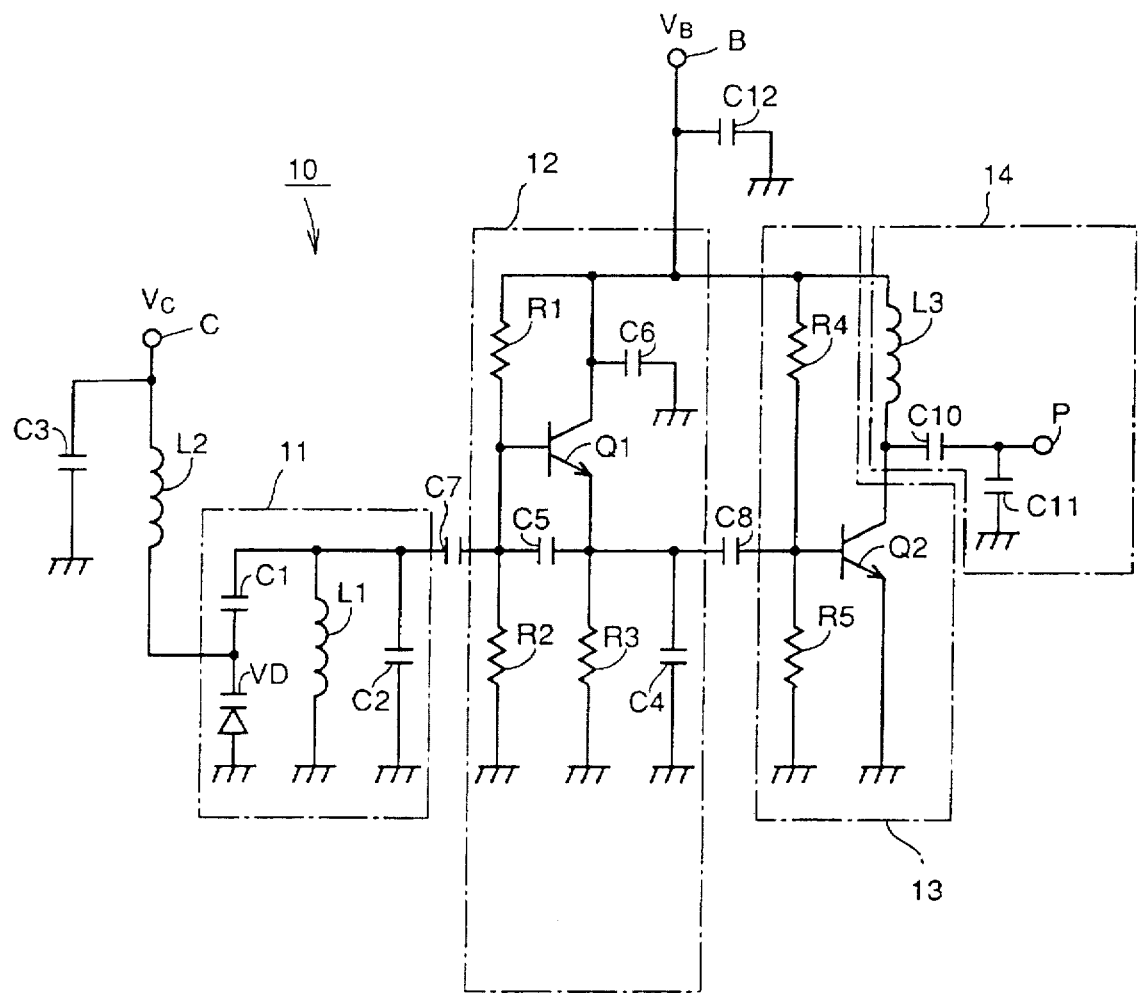
FIG. 1 is a circuit diagram showing an example of a conventional VCO.
Figure 2:
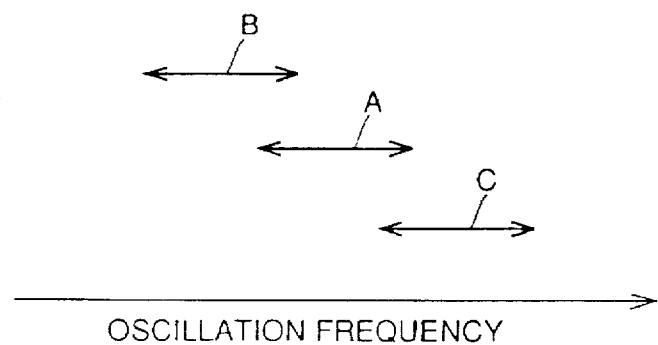
FIG. 2 is a diagram for describing a shift in the oscillation frequency variable range of a conventional VCO.

Oscillation stage 2, buffer stage 3, and output matching stage 4 have structures identical to those shown in FIG. 1. It is to be noted that the circuit structure of each of the stages may be formed of other circuits as long as it has the same function. Buffer stage 3 and output matching stage 4 are not always necessary. A VCO having the above-described circuit structure has each component mounted on a substrate.

Figure 4:
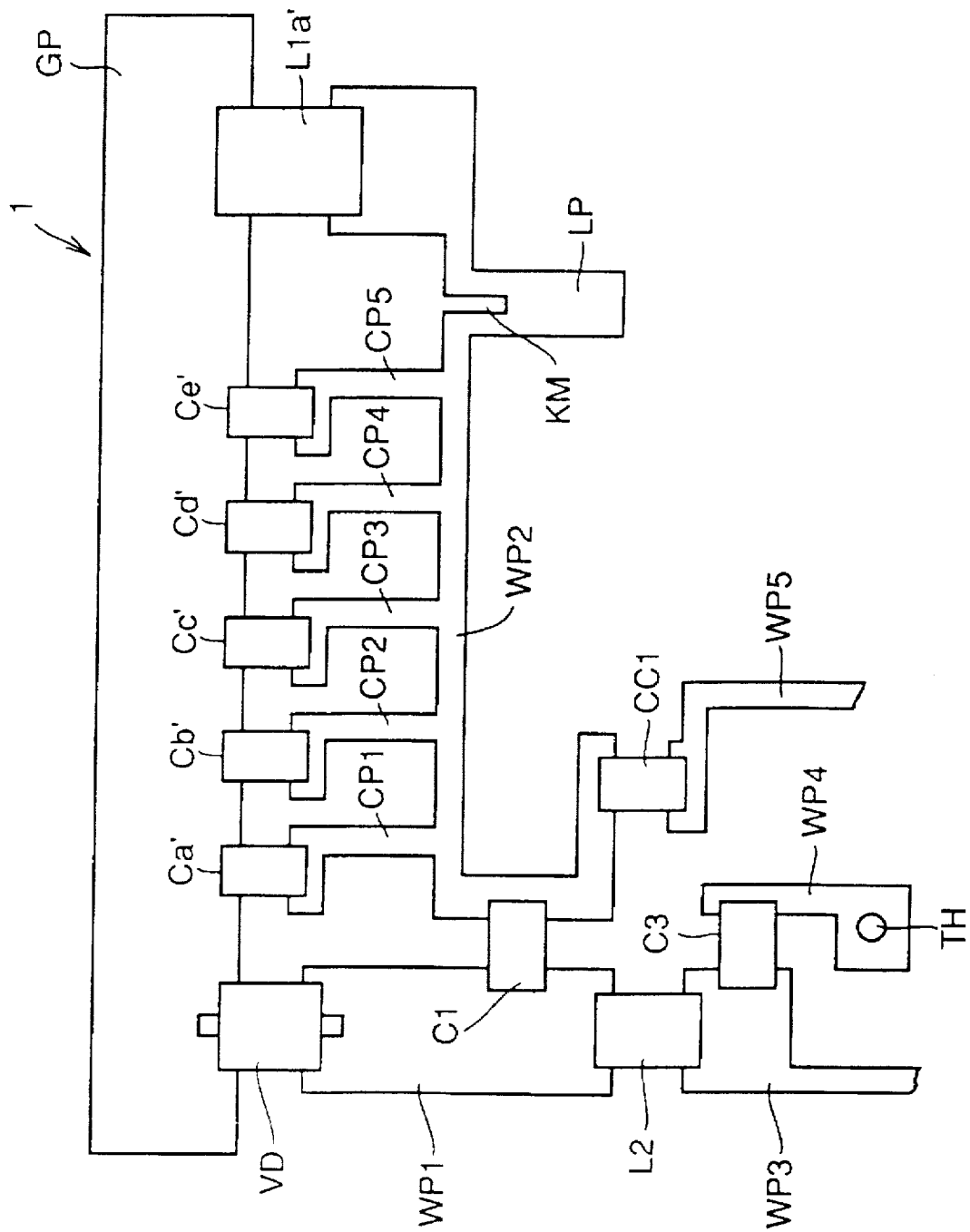
FIG. 4 is a plan view showing a package arrangement of components on a substrate of the oscillation circuit in the embodiment of FIG. 3.

FIG. 4 shows a component mounted arrangement on the substrate in the resonance circuit 1 shown in FIG. 3. Referring to FIG. 4, coupling capacitor C1 forming resonance circuit 1 is connected to a first wiring pattern WP1 and a second wiring pattern WP2. Variable capacitance diode VD is connected to first wiring pattern WP1 and a ground pattern GP. Main inductor L1a forming resonance inductor L1 is connected to a second wiring pattern WP2 and ground pattern GP using a chip inductor L1a'. The plurality of capacitors Ca, Cb, Cc, Cd, and Ce forming resonance capacitor C2 are connected to second wiring pattern WP2 and ground pattern GP via connection patterns CP1, CP2, CP3, CP4, and CP5, respectively, using chip layered capacitors Ca', Cb', Cc', Cd', and Ce', respectively. Connection patterns CP1–CP5 are arranged parallel to each other at the second wiring pattern WP2 side. Alternatively, they may be provided at the ground pattern GP side, or at both sides of second wiring pattern WP2 and ground pattern GP.

Fine adjustment inductor L1b included in resonance inductor L1 is formed at second wiring pattern WP2 between chip inductor L1a' and chip layered capacitors Ca'–Ce' as an inductance fine adjustment pattern LP. C/N characteristics compensation inductor L2 is connected to first wiring pattern WP1 and a third wiring pattern WP3. High-frequency bypass capacitor C3 is connected to third wiring pattern WP3 and a fourth wiring pattern WP4.

Coupling capacitor CC1 provided between resonance circuit 1 and oscillation stage 2 is connected to second wiring pattern WP2 and a fifth wiring pattern WP5. Third wiring pattern WP3 is connected to control terminal C shown in FIG. 3. Fourth wiring pattern WP4 is connected to a ground pattern formed substantially all over the bottom side surface of the substrate via a through hole TH formed in the substrate. Fifth wiring pattern WP5 is connected to oscillation stage 2 shown in FIG. 3. A chip layered capacitor is used for coupling capacitors C1, CC1 and high-frequency bypass capacitor C3. A chip inductor is used for C/N characteristics compensation inductor L2. The variable capacitance diode VD is a surface mountable type.

In order to adjust the oscillation frequency variable range of a VCO in resonance circuit 1 having each component mounted as shown in FIG. 4, connection pattern CP5 is first disconnected by directing a laser beam thereto, whereby chip layered capacitor Ce' is isolated from resonance circuit 1. As a result, the capacitance of resonance capacitor C2 is reduced, so that the resonance frequency of resonance circuit 1 is shifted to a higher level. The oscillation frequency variable range that can be adjusted by variable capacitance diode VD is thereby shifted to a higher level of frequency. When chip layered capacitors Ca'–Ce' are all connected, the resonance frequency of resonance circuit 1 must be set lower than a predetermined value whereby the oscillation frequency variable range that can be adjusted by variable capacitance diode VD is set at a level lower than a predetermined range set in advance.

If the oscillation frequency variable range that can be adjusted by variable capacitance diode VD is shifted to a level higher than the predetermined range after connection pattern CP5 is disconnected, the disconnection process of connection patterns CP1–CP5 ends. But if the oscillation frequency variable range is not shifted to a level higher than the predetermined range by just disconnecting connection pattern CP5, the remaining connection patterns CP4 - CP1 are sequentially disconnected until the oscillation frequency variable range is shifted to a level higher than the predetermined range.

Then, by directing a laser beam to inductor fine adjustment pattern LP to form a kerf KM as shown in FIG. 4 to partially remove the pattern, the inductance of the inductor adjustment pattern LP is increased. This causes an increase in the inductance of resonance inductor L1, whereby the resonance frequency of resonance circuit 1 is shifted to a lower level, and the oscillation frequency variable range covered by the variable capacitance diode VD is shifted to a lower level of frequency. Since the inductance of the inductance fine adjustment pattern LP portion can be continuously adjusted by varying the width and length of kerf KM, the inductance of resonance inductor L1 can be adjusted to fine-adjust the oscillation frequency variable range, that was temporarily shifted to the level higher than the predetermined range, so that it finally comes within the predetermined range.

According to the method of adjusting the oscillation frequency variable range of a VCO of the present invention, disconnection of connection patterns CP1–CP5 formed on a substrate allows adjustment of the capacitance of resonance capacitor C2. Also, inductance fine adjustment pattern LP formed on the substrate is partially removed to adjust the inductance of resonance inductor L1. Automation is facilitated since the disconnection and removal processes can be carried out by means of directing a laser beam. Therefore, adjustment of the oscillation frequency variable range is facilitated. Furthermore, the inductance of resonance inductor L1 can be adjusted in a critical manner, so that fine adjustment of the oscillation frequency variable range is possible. Since resonance capacitor C2 is formed of chip layered capacitors Ca'–Ce', and resonance inductor L1 is formed of chip inductor L1a' and inductance fine adjustment pattern LP, the VCO will not be increased in size.

It is to be noted that the inductance of inductance fine adjustment pattern LP can be adjusted by forming a kerf at a position different from that shown in FIG. 4.

By increasing the number of chip layered capacitors forming resonance capacitor C2 and reducing the capacitance per capacitor, the oscillation frequency variable range can be adjusted finely over a predetermined range by just sequentially disconnecting the respective connection patterns to adjust the capacitance of resonance capacitor C2. In this case, it is not particularly necessary to provide fine adjustment inductor L1b (inductance fine adjustment pattern LP). This omission will not mar the easy adjustment of the oscillation frequency variable range, and the VCO will not be increased in size.

The parallel arrangement of connection patterns CP1–CP5 connected to chip layout capacitors Ca'–Ce' as shown in the embodiment of FIG. 4 provides the advantage that the disconnection process is facilitated since sequential disconnection can be carried out from a connection pattern at one end, i.e. connection pattern CP5, towards the connection pattern at the other end, i.e. connection pattern CP1. However, the arrangement of connection patterns CP1–CP5 is not limited to that shown in FIG. 4.

Fine adjustment is possible, particularly in the case where the oscillation frequency variable range is adjusted by just varying the capacitance of resonance capacitor C2, by differentiating the capacitance of at least some of the chip layered capacitors Ca'–Ce' and disconnecting the connection pattern of a chip layered capacitor having a higher capacitance prior to the connection pattern of a chip layered capacitor having a lower capacitance. In this case, the connection patterns can be sequentially disconnected in the order of the level of their capacitances by disposing the connection pattern of a chip layered capacitor having a high capacitance at one end and the connection pattern of a chip layered capacitor of a small capacitance at the other end. Such a structure can also be applied where the inductance of resonance inductor L1 includes a fine adjustment inductor L1b (inductance fine adjustment pattern LP).

According to the present embodiment, resonance capacitor C2 of resonance circuit 1 is formed of a plurality of chip layered capacitors connected in parallel via connection patterns on a substrate. The capacitance of resonance capacitor C2 is adjusted by disconnecting the connection pattern. Automation of the disconnection process is facilitated, which in turn facilitates the adjustment of the oscillation frequency variable range. Furthermore, since resonance capacitor C2 is formed of a chip layered capacitors the VCO will not be increased in size. Additionally, resonance inductance L1 is formed of chip inductor L1a' and inductance fine adjustment pattern LP. Since the inductance of resonance inductor L1 is adjusted by partially removing inductance fine adjustment pattern LP, the disconnection process of the disconnection pattern and the removal process of the inductance fine adjustment pattern LP are both facilitated, which in turn facilitates adjustment of the oscillation frequency variable range. Since resonance capacitor C2 is formed of chip layered capacitor, and resonance inductor L1 is formed of a chip inductor L1a' and an inductance fine adjustment pattern LP, the VCO will not increase in size.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of adjusting an oscillation frequency variable range of a voltage-controlled oscillator including a resonance circuit having a resonance inductor, a resonance capacitor, and a variable capacitance diode on a substrate and connected in said resonance circuit with connection patterns, said resonance inductor being formed of a chip inductor and an inductance fine adjustment pattern on said substrate, said resonance capacitor including a plurality of chip capacitors connected in parallel, wherein a control voltage for controlling an oscillation frequency of said voltage-controlled oscillator is supplied to said variable capacitance diode, said method comprising the steps of:

selecting a capacitance value of all said chip capacitors connected in parallel so that the oscillation frequency variable range is at a level lower than a desired predetermined range, sequentially disconnecting said connection patterns to isolate at least a respective one of said plurality of chip capacitors from said resonance circuit to reduce the capacitance of said resonance capacitor, whereby the oscillation frequency variable range is temporarily shifted to a level higher than the predetermined range, and partially removing said inductance fine adjustment pattern to increase the inductance of said resonance inductor, whereby the oscillation frequency variable range is shifted to a lower level and thereby adjusted to said desired predetermined range.

2. The method of adjusting an oscillation frequency variable range according to a voltage-controlled oscillator according to claim 1, wherein said connection patterns are sequentially disconnected from one end towards another end along a longitudinal direction of said substrate.

3. The method of adjusting an oscillation frequency variable range of a voltage-controlled oscillator according to claim 1, wherein said plurality of chip capacitors include capacitors having different capacitance, a connection pattern of a chip capacitor having a relatively high capacitance being disconnected prior to a connection pattern of a chip capacitor having a relatively small capacitance.

4. The method of adjusting an oscillation frequency variable range of a voltage-controlled oscillator according to claim 2, wherein said plurality of chip capacitors comprise capacitors having different capacitance, a connection pattern corresponding to a capacitor of a relatively high capacitance being disposed toward one end along a longitudinal direction of said substrate, and a connection pattern of a capacitor of a relatively small capacitance being disposed toward another end of said substrate.

5. The method of adjusting an oscillation frequency variable range of a voltage-controlled oscillator according to claim 1, wherein said connection patterns are substantially parallel to each other.

6. The method of adjusting an oscillation frequency variable range of a voltage-controlled oscillator according to claim 1; wherein said connection patterns are substantially perpendicular to said longitudinal direction.

7. The method of adjusting an oscillation frequency variable range of a voltage-controlled oscillator according to claim 3, wherein said chip capacitors are disposed along a longitudinal direction of said substrate in descending order of capacitance.

\* \* \* \* \*